(12) United States Patent
Takeuchi

(10) Patent No.: US 8,737,629 B2
(45) Date of Patent: May 27, 2014

(54) AUDIO SIGNAL PROCESSING SYSTEM

(75) Inventor: Eiji Takeuchi, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 1650 days.

(21) Appl. No.: 11/903,775

(22) Filed: Sep. 24, 2007

(65) Prior Publication Data

US 2008/0089524 A1 Apr. 17, 2008

(30) Foreign Application Priority Data

Sep. 25, 2006 (JP) ................................. 2006-259162

(51) Int. Cl.
*H03G 3/20* (2006.01)

(52) U.S. Cl.
USPC ........................................... 381/57; 381/73.1

(58) Field of Classification Search
USPC ............................................. 381/56, 57, 73.1
See application file for complete search history.

(56) References Cited

U.S. PATENT DOCUMENTS

| | | | | |
|---|---|---|---|---|
| 5,699,437 | A | * | 12/1997 | Finn .............................. 381/71.7 |
| 6,906,632 | B2 | * | 6/2005 | DeLine et al. ............. 340/815.4 |
| 2003/0219133 | A1 | * | 11/2003 | Horrall et al. ................ 381/73.1 |
| 2004/0057586 | A1 | * | 3/2004 | Licht ............................ 381/94.7 |
| 2007/0127734 | A1 | * | 6/2007 | Brulle-Drews ................. 381/86 |
| 2007/0297620 | A1 | * | 12/2007 | Choy ........................... 381/73.1 |
| 2009/0154713 | A1 | * | 6/2009 | Kamiya ............................. 381/1 |

FOREIGN PATENT DOCUMENTS

| | | |
|---|---|---|
| JP | H4-170299 | 6/1992 |
| JP | 05-345549 | 12/1993 |
| JP | 07-319479 | 12/1995 |
| JP | H9-171387 | 6/1997 |
| JP | H10-92054 | 4/1998 |
| JP | H11-213635 | 8/1999 |
| JP | 2001-95082 | 4/2001 |
| JP | 2001-343990 | 12/2001 |
| JP | 2003-024627 | 1/2003 |
| JP | 2003-235092 | 8/2003 |
| JP | 2003-307997 | 10/2003 |
| JP | 2004-170621 | 6/2004 |
| JP | 2005-191851 | 1/2005 |
| JP | 2005-084645 | 3/2005 |
| JP | 2005-286862 | 10/2005 |
| JP | 2005-343401 | 12/2005 |
| JP | 2006-53435 | 2/2006 |
| JP | 2006-154144 | 6/2006 |
| JP | 2007-19980 | 1/2007 |
| WO | WO 2006/038429 | 4/2006 |

* cited by examiner

*Primary Examiner* — Benjamin Sandvik
(74) *Attorney, Agent, or Firm* — Crowell & Moring LLP

(57) ABSTRACT

An audio signal processing system includes: a receiving section which receives a plurality of audio signals, a process period specifying section which specifies a silent period in other audio signals except a particular audio signal that are received by the receiving section, respectively, a sound volume level adjusting section which decreases a sound volume level of the particular audio signal, in a period specified by the process period specifying section as a silent period in any of the other audio signals, and an outputting section which outputs the particular audio signal whose sound volume level is adjusted by the sound volume level adjusting section.

20 Claims, 16 Drawing Sheets

FIG. 15A
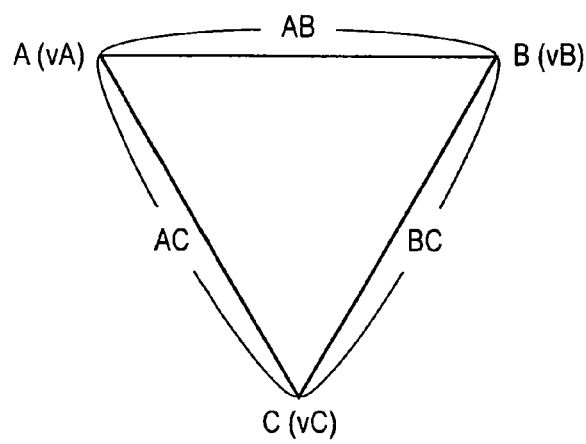
FIG. 15B
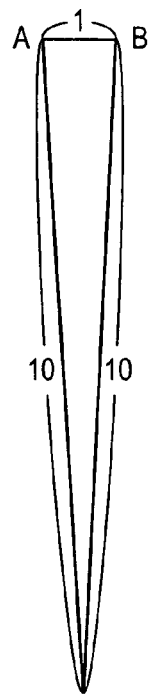
FIG. 15C
| TIME \ SOUND VOLUME LEVEL | vA | vB | vC | ⇒ | vA* | vB* | vC* |
|---|---|---|---|---|---|---|---|
| t1 | 1 | 1 | 1 | | 1 | 1 | 1 |
| t2 | 10 | 1 | 1 | | 9.01 | 1.9 | 1.09 |
| t3 | 1 | 1 | 10 | | 1.09 | 1.09 | 9.82 |

AUDIO SIGNAL PROCESSING SYSTEM

BACKGROUND OF THE INVENTION

The present invention relates to the technology to process an audio signal.

In a hall, a tearoom, and the like, for example, the necessity of providing different sound contents (information, music, etc.) every nearby area arises occasionally. In such case, such a problem comes up that, when the speaker is provided on an each area basis, respective sound contents leak out to the surrounding areas. In the prior art, various measures such as an adjustment in an arrangement of the speakers or a sound volume level of the contents, a provision of a sound insulating wall at a boundary between the areas, and the like have been taken against the above problem.

For example, in Patent Literature 1, the technology called the sound image normalizing system to form a directional acoustic space by a parametric speaker is disclosed. Also, in Patent Literature 2, the technology called the active noise control to reduce a noise by generating the sound that has an opposite phase to the surrounding noise is disclosed. Also, in Patent Literature 3, the technology to reduce a gear noise reaching the inside of a car by utilizing the so-called masking effect, which reduces the noise by generating a sound whose acoustic characteristic is analogous to the noise, is disclosed.

[Patent Literature 1] JP-A-5-345549
[Patent Literature 2] JP-A-7-319479
[Patent Literature 3] JP-A-2005-343401

For example, with respect to the gear noise in Patent Literature 3, the masking sound suitable to mask the noise can be decided previously by specifying the acoustic characteristic in advance. However, in the hall, the tearoom, and the like, since the sound contents are reproduced in answer to a user's desire every area, it is impossible to decide in advance the characteristics, etc. of the masking sound.

SUMMARY OF THE INVENTION

The present invention has been made in view of the above problems, and it is an object of the present invention to provide the technology to suppress such a circumstance that, in emitting different sound contents in neighboring areas, the contents leak out to surrounding areas to have a mutual influence on each other.

A first embodiment of an audio signal processing system according to the present invention, includes a receiving section which receives a plurality of audio signals; a process period specifying section which specifies a silent period in other audio signals except a particular audio signal received by the receiving section, respectively; a sound volume level adjusting section which decreases a sound volume level of the particular audio signal, in a period specified by the process period specifying section as a silent period in any of the other audio signals; and an outputting section which outputs the particular audio signal whose sound volume level is adjusted by the sound volume level adjusting section.

Also, a second embodiment of an audio signal processing system according to the present invention, includes a receiving section which receives a plurality of audio signals; a process period specifying section which specifies a silent period in other audio signals except a particular audio signal received by the receiving section received, respectively; a frequency characteristic correcting section which executes either a process of removing a predetermined frequency band component from the particular audio signal or a process of correcting the particular audio signal into an audio signal having a frequency characteristic that is similar to the other audio signals, in a period specified by the process period specifying section as the silent period in any of the other audio signals; and an outputting section which outputs the particular audio signal whose frequency characteristic is corrected by the frequency characteristic correcting section.

Also, a third embodiment of an audio signal processing system according to the present invention, includes a receiving section which receives a plurality of audio signals; a process period specifying section which specifies a silent period in a particular audio signal received by the receiving section; an audio signal generating section which generates a second audio signal with respect to the particular audio signal, in a period specified by the process period specifying section as the silent period in the particular audio signal; and an outputting section which superposes the second audio signal on the particular audio signal, and outputting a resultant audio signal.

Also, a fourth embodiment of an audio signal processing system according to the present invention, includes a receiving section which receives a plurality of audio signals; a process period specifying section which specifies a non-silent period in the plurality of audio signals received by the receiving section, respectively; a sound volume level adjusting section which adjusts a sound volume level of the particular audio signal received by the receiving section to come close to a mean value of the sound volume levels of the plurality of audio signals, in a period specified by the process period specifying section as a non-silent period in all of the plurality of audio signals; and an outputting section which outputs the particular audio signal whose sound volume level is adjusted by the sound volume level adjusting section.

Also, a fifth embodiment of an audio signal processing system according to the present invention, includes a receiving section which receives a plurality of audio signals; a process period specifying section which specifies a non-silent period in the plurality of audio signals received by the receiving section, respectively; a frequency characteristic correcting section which executes either a process of removing a predetermined frequency band component from the particular audio signal received by the receiving section or a process of correcting the particular audio signal into an audio signal having a frequency characteristic that is similar to the other audio signals except the particular audio signal received by the receiving section, in a period specified by the process period specifying section as the non-silent period in all of the plurality of audio signals; and an outputting section which outputs the particular audio signal whose frequency characteristic is corrected by the frequency characteristic correcting section.

Also, a sixth embodiment of an audio signal processing system according to the present invention, includes a receiving section which receives a plurality of audio signals; a process period specifying section which specifies a non-silent period in the plurality of audio signals received by the receiving section, respectively; an audio signal generating section which generates a second audio signal to correspond to the particular audio signal received by the receiving section, in a period specified by the process period specifying section as the non-silent period in all of the plurality of audio signals; and an outputting section which superposes the second audio signal on the particular audio signal, and outputting a resultant audio signal.

Also, as the preferred mode of the audio signal processing system according to the present invention, in the third or sixth embodiment, the audio signal generating section has a frequency characteristic sensing section which senses frequency characteristic of the other audio signals, and a similar characteristic signal generating section which generates the second audio signal having a frequency characteristic that is similar to the frequency characteristic sensed by the frequency characteristic sensing section and that has a low similarity to the frequency characteristic of the particular audio signal.

Also, as the preferred mode of the audio signal processing system according to the present invention, in the third or sixth embodiment, the audio signal generating section generates the second audio signal whose phase is opposite to the other audio signals.

Also, as the preferred mode of the audio signal processing system according to the present invention, in any one of first to third embodiments, the process period specifying section has a sound volume level sensing section which senses sound volume levels of the plurality of audio signals that are received by the receiving section, and a specifying section which specifies a period during which the sound volume level sensed by the sound volume level sensing section is below a predetermined level continuously in excess of a predetermined time, as the silent period.

Also, as the preferred mode of the audio signal processing system according to the present invention, in any one of fourth to sixth embodiments, the process period specifying section has a sound volume level sensing section which senses sound volume levels of the plurality of audio signals that are received by the receiving section, and a specifying section which specifies a period during which the sound volume level sensed by he sound volume level sensing section exceeds a predetermined level as the non-silent period.

Also, as the preferred mode of the audio signal processing system according to the present invention, in any one of first to third embodiments, the process period specifying section has a specifying section which receives data indicating silent periods attached to the plurality of audio signals, and specifying the silent periods of the plurality of audio signals from the data.

Also, as the preferred mode of the audio signal processing system according to the present invention, in any one of fourth to sixth embodiments, the process period specifying section has a specifying section which receives data indicating non-silent periods attached to the plurality of audio signals, and specifying the non-silent periods of the plurality of audio signals from the data.

According to the present invention, it is feasible to suppress such a circumstance that, in emitting different sound contents in neighboring areas, the contents leak out to surrounding areas to have a mutual influence on each other.

BRIEF DESCRIPTION OF THE DRAWINGS

The above objects and advantages of the present invention will become more apparent by describing in detail preferred exemplary embodiments thereof with reference to the accompanying drawings, wherein:

FIGS. 15A to 15C are views explaining a sound volume level adjusting method.

DETAILED DESCRIPTION OF THE PREFERRED EMBODIMENTS

Embodiments of the present invention will be explained with reference to the drawings hereinafter.

A: First Embodiment (A-1: Configuration of First Embodiment)

Figure 1:
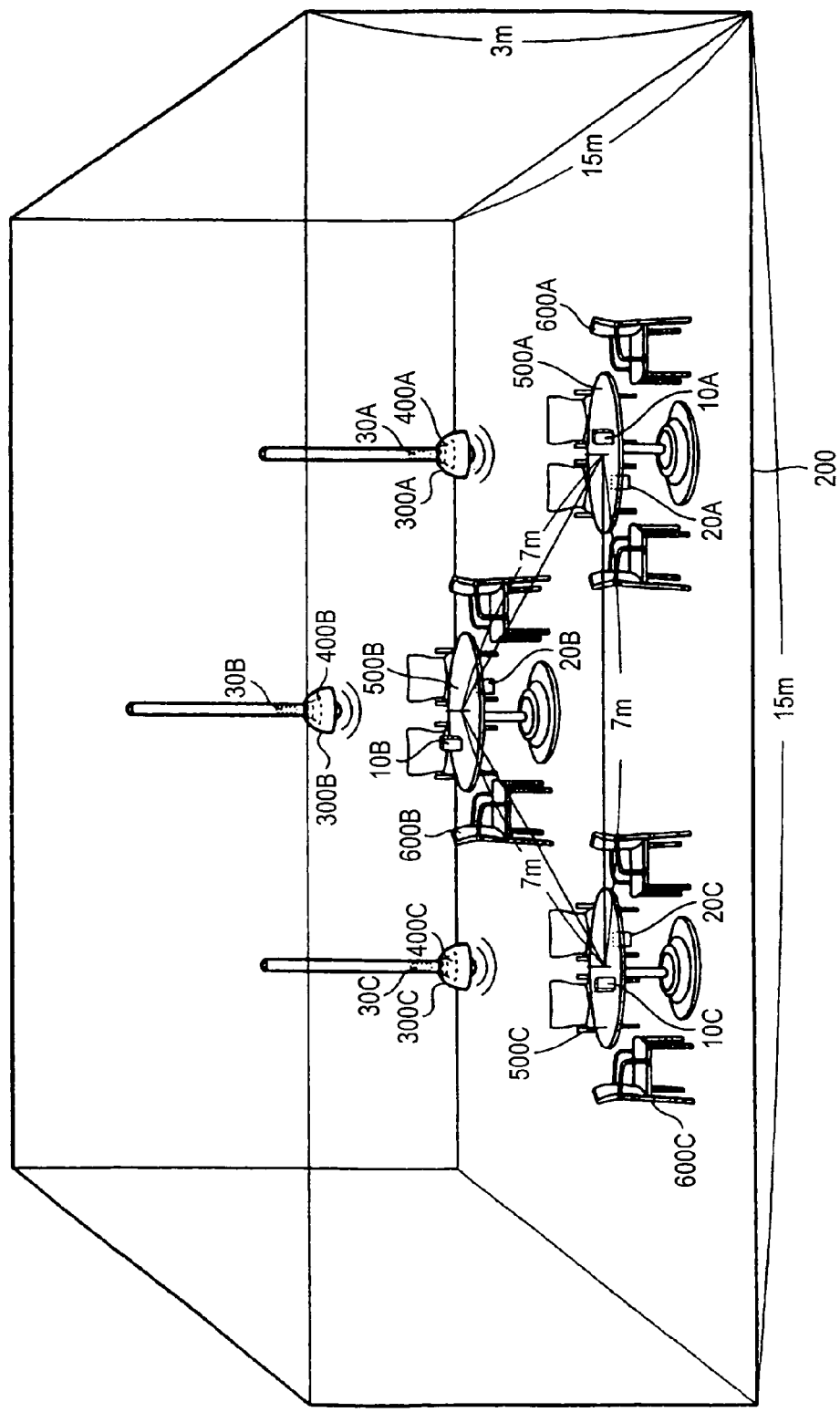
FIG. 1 is a view showing an overall configuration of a hall 200 into which an audio signal processing system 1 according to embodiments is installed.

FIG. 1 is a view showing an outline of a hall 200 into which an audio signal processing system 1 according to the present invention is installed. As shown in FIG. 1, the hall 200 with sides of 15 meter and a ceiling height of 3 meter is prepared. Three tables 500A, 500B, and 500C are provided in the hall 200 to be separated mutually such that distances between their centers are set to 7 meter respectively. Four chairs 600A, 600B, and 600C are arranged around each table respectively. Also, illuminations 300A, 300B, 300C are hung from the ceiling over the tables 500A, 500B, and 500C respectively. A lamp of the illumination is surrounded by a "lampshade".

In the present embodiment, explanation is made of the case where the hall 200 with sides of 15 meter and a ceiling height of 3 meter is prepared. It is needless to say that a scale of the hall is not limited to such values. Also, in the present embodiment, explanation is made of the case where three tables are arranged in the hall 200 to be separated by 7 meter mutually like a regular triangle. But the number of tables arranged in the hall may be of course set to 2 or 4 or more, and an arrangement of tables is not limited to this mode. Also, the number of chairs arranged around each table is not limited to 4. Also, the number of chairs may be of course set differently every table.

Then, various devices constituting the audio signal processing system 1 are arranged around the tables 500A, 500B, and 500C as follows. An audio signal generating device 10A is put on the table 500A, an acoustic characteristic sensing device 20A is provided under the table 500A, and the acoustic characteristic sensing device 20A is connected to the audio signal generating device 10A. An audio signal processing device 30A and a speaker 400A are provided on the inside of the lampshade of the illumination 300A held over the table 500A. The audio signal processing device 30A is connected to the speaker 400A.

Figure 2:
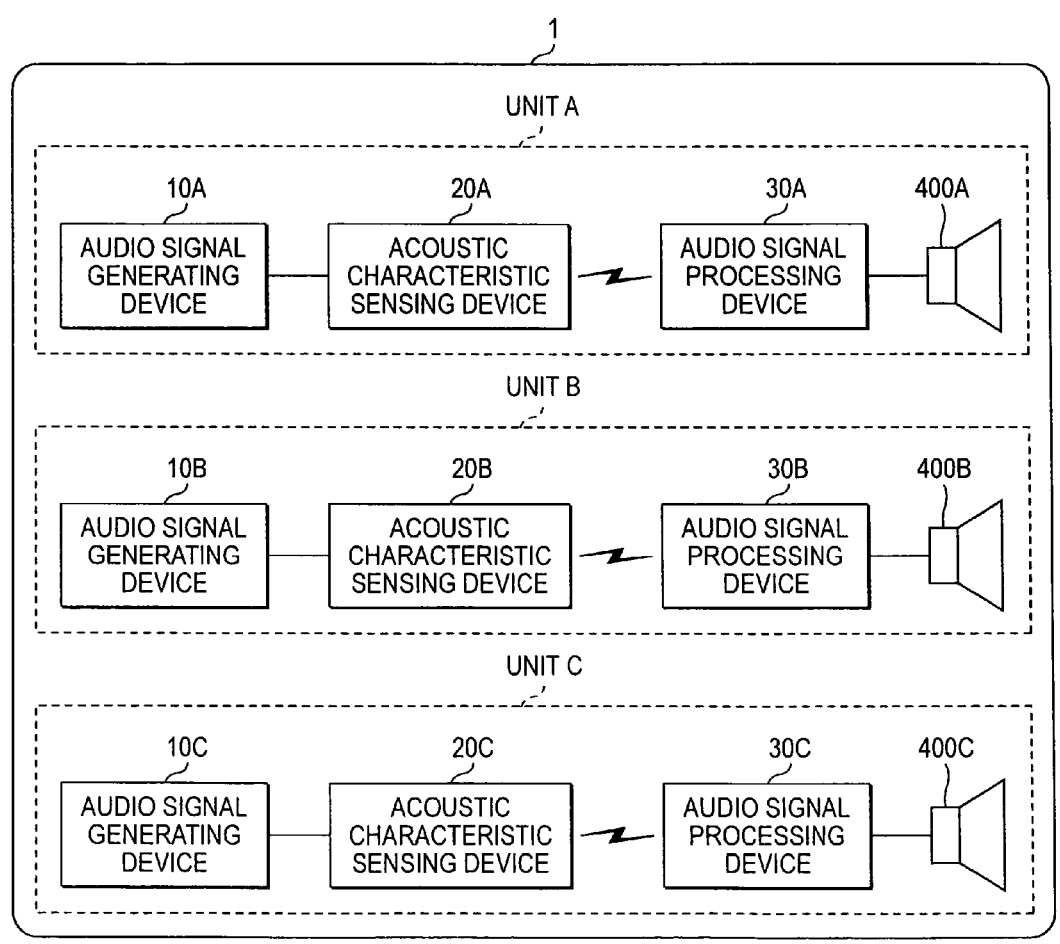
FIG. 2 is a block diagram showing a schematic configuration of the audio signal processing system 1 according to embodiments.

FIG. 2 is a block diagram showing a configuration of the above audio signal processing system 1. The audio signal generating device 10A, the acoustic characteristic sensing device 20A, the audio signal processing device 30A, and the speaker 400A shown in FIG. 2 are called integrally as a unit A hereinafter. In FIG. 1, a unit B and a unit C are provided similarly to the table 500B and the table 500C respectively.

Here, when there is no need to discriminate the tables 500A, 500B and 500C individually, each of these tables is referred to as the "table 500" hereinafter. Similarly, when there is no need to discriminate the chairs, the illuminations, the audio signal generating devices, the acoustic characteristic sensing devices, the audio signal processing device, and the speakers individually, they are referred herein to as the "chair 600", the "illumination 300", the "audio signal generating device 10", the "acoustic characteristic sensing device 20", the "audio signal processing device 30", and the "speaker 400" respectively. In contrast, in the following explanation, when there is a need to indicate to which one of tables respective internal configurations of the audio signal generating device 10, the acoustic characteristic sensing device 20, and the audio signal processing device 30 belong, an alphabet "A", "B", or "C" is appended to the concerned reference symbol. Conversely, when there is no need to discriminate these internal configurations individually, no alphabet is appended.

The audio signal generating device 10 is a mobile audio device, for example, and outputs an audio signal representing the contents such as the sound, the music piece, or the like stored in a storing section (not shown) in a digital form to the connected acoustic characteristic sensing device 20. Here, the audio signals output from the audio signal generating devices 10A, 10B, and 10C are called contents A, B, and C hereinafter respectively.

Here, the "contents" indicate a series of audio signals that the audio signal generating device 10 outputs. For example, when plural music pieces such as a music piece A-1, a music piece A-2, . . . are stored in the audio signal generating device 10A and these music pieces are played sequentially while putting an interval of several seconds between them, all music pieces including the intervals are called all together the contents A. Therefore, the end of the contents A denotes the stage all music pieces contained in the audio signal generating device 10A are completely ended and the case where a power supply of the audio signal generating device 10A is turned OFF, but does not contain the case where the music piece A-1 ends but the music piece A-2 follows subsequently at the interval, or the like, for example.

Figure 3:
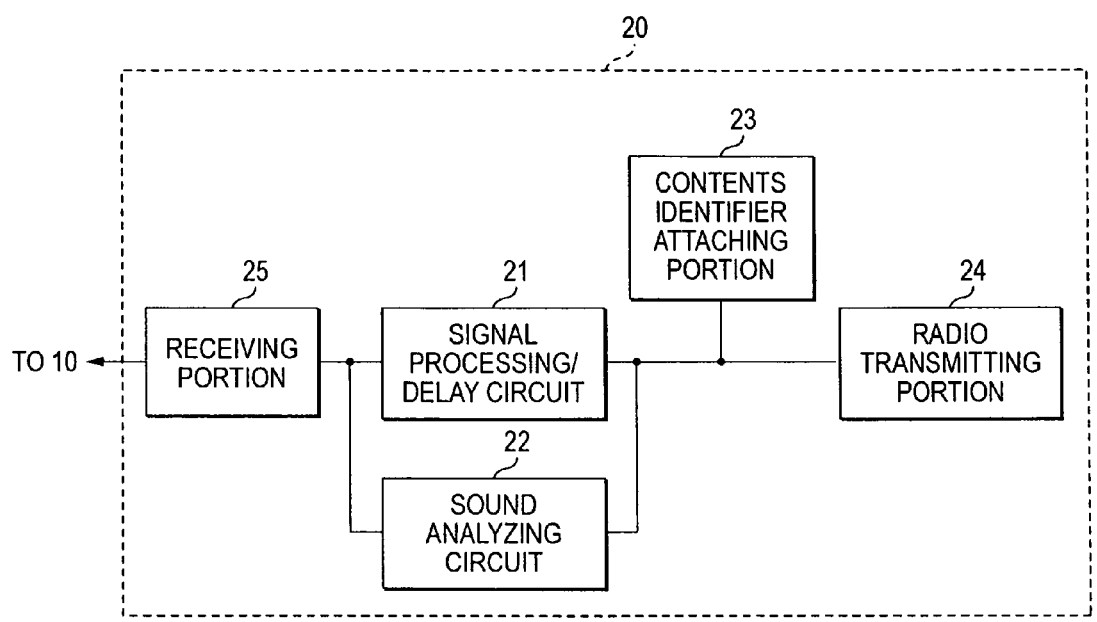
FIG. 3 is a block diagram showing a configuration of an acoustic characteristic sensing device 20.

Next, a functional configuration of the acoustic characteristic sensing device 20 will be explained hereunder. FIG. 3 is a block diagram showing a configuration of the acoustic characteristic sensing device 20. The acoustic characteristic sensing device 20 has a signal processing/delaying circuit 21, a sound analyzing circuit 22, a contents identifier attaching portion 23, a radio transmitting portion 24, and a receiving portion 25.

The receiving portion 25 receives the audio signal that the audio signal generating device 10 outputs, and output the signal to the signal processing/delaying circuit 21 and the sound analyzing circuit 22.

The signal processing/delaying circuit 21 receives the audio signal from the receiving portion 25, and stores the signal therein.

The sound analyzing circuit 22 receives the audio signal from the receiving portion 25, and specifies the acoustic characteristic of the contents from the audio signal.

Figure 5:
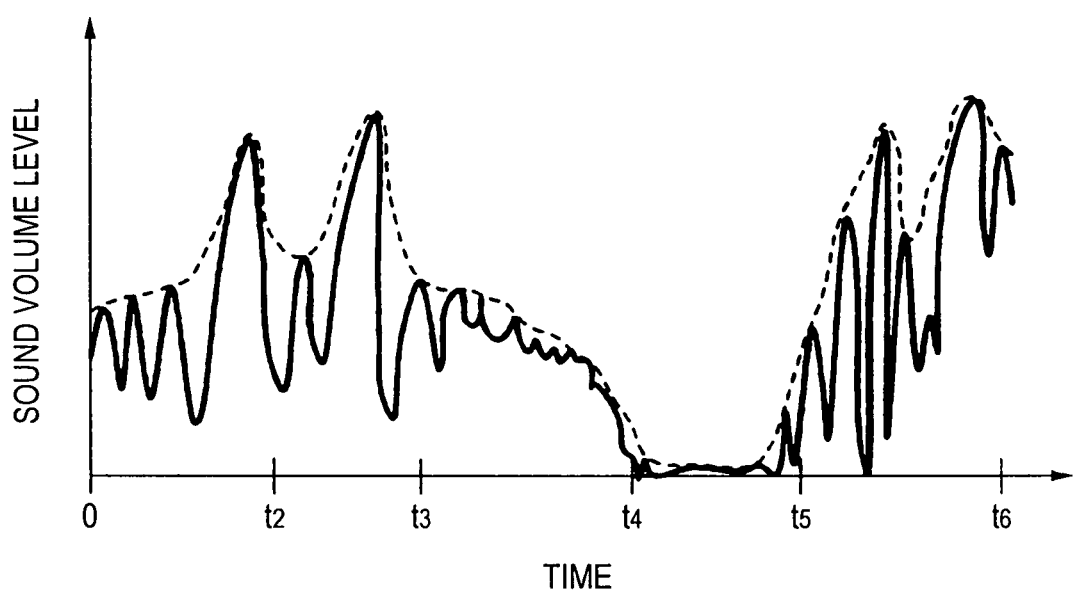
FIG. 5 is a view explaining a method of sensing a sound volume level.

Here, the acoustic characteristic relates to a sound volume level and a frequency characteristic of the contents. The sound analyzing circuit 22 senses a sound volume level of the contents as follows. FIG. 5 is a graph showing a time dependent change of a sound volume level of the contents from a time 0 to a time t6. A solid line gives a sound volume level of the contents A that the sound analyzing circuit 22 receives from the receiving portion 25. The sound analyzing circuit 22 generates an envelope signal showing an envelope (a broken line in FIG. 5) of a curve indicating the sound volume level.

The contents identifier attaching portion 23 attaches a contents identifier (an identifier used to identify uniquely from which audio signal generating device 10 the contents are output and, in the present embodiment, an identifier attached to each acoustic characteristic sensing device 20) to the audio signal.

The radio transmitting portion 24 converts the audio signal, the acoustic characteristic, and the contents identifier into a radio wave signal and transmits it as a group of signals (referred to as a "near field radio communication" hereinafter).

Figure 4:
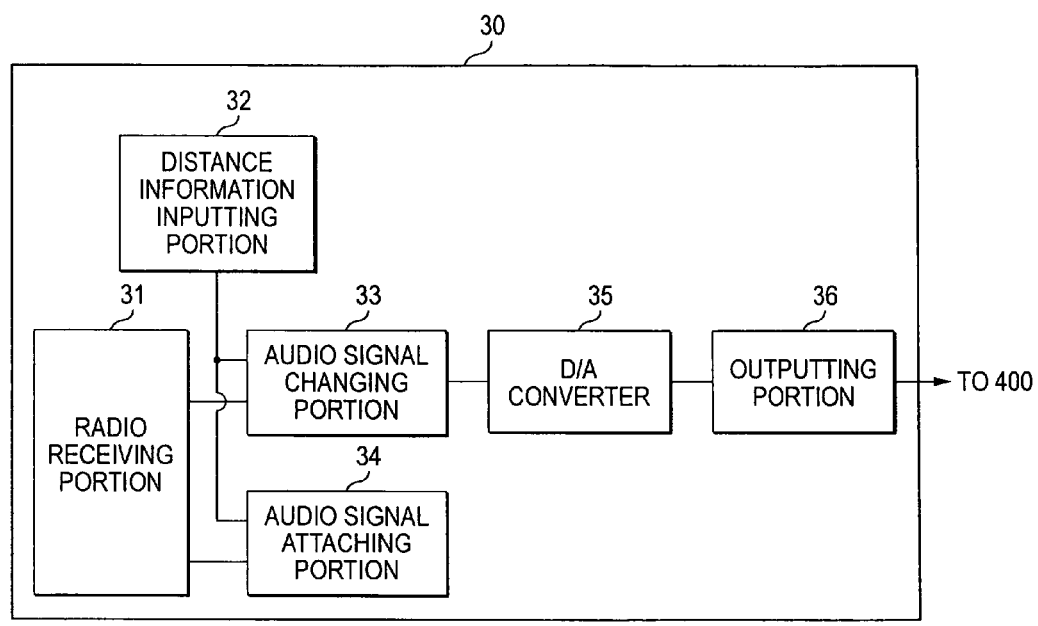
FIG. 4 is a block diagram showing a configuration of an audio signal processing device 30.

Next, the audio signal processing device 30 will be explained hereunder. FIG. 4 is a block diagram showing a configuration of the audio signal processing device 30. The audio signal processing device 30 has a radio receiving portion 31, a distance information inputting portion 32, an audio signal modifying portion 33, an audio signal attaching portion 34, a D/A converter 35, and an outputting portion 36.

The radio receiving portion 31 receives a signal that the radio transmitting portion 24 transmits, and outputs the signal to the audio signal modifying portion 33 and the audio signal attaching portion 34. In the near field radio communication, since the transmitted signal attenuates with a distance, the radio receiving portion 31 can receive only the signal that is output from the radio transmitting portion 24 located within a particular distance range. In the present embodiment, a particular distance is about 8 m, and the radio receiving portion 31 receives the signals transmitted from all acoustic characteristic sensing devices 20 contained in the audio signal processing system 1.

When the radio receiving portion 31 receives the signal from the radio transmitting portion 24, it discriminates the contents identifier contained in the received signal. When this signal corresponds to the signal transmitted from the acoustic characteristic sensing device 20 belonging to the same unit as this radio receiving portion 31, the radio receiving portion 31 receives all information (the audio signal, the acoustic characteristic, and the contents identifier) contained in the received signal. In contrast, when the contents are transmitted from the acoustic characteristic sensing device 20 belonging to the different unit, the radio receiving portion 31 receives only the data about the acoustic characteristic and the contents identifier. In other words, concretely the radio receiving portion 31A receives the audio signal, the acoustic characteristic, and the contents identifier of the contents A, the acoustic characteristic and the contents identifier of the contents B, and the acoustic characteristic and the contents identifier of the contents C, for example.

The distance information inputting portion 32 has a displaying section (not shown) and an inputting section (not shown). The displaying section calls upon an administrator of the audio signal processing system 1 to input a distance between the speakers 400. The inputting section outputs the data about the distance being input by the administrator to the audio signal modifying portion 33 and the audio signal attaching portion 34. In the present embodiment, a distance between the speakers by which respective contents are reproduced is input as 7 m between the contents A and B, the contents A and C, and the contents B and C.

The audio signal modifying portion 33 applies an adjustment of the sound volume level and an adjustment of the frequency characteristic to the audio signal of the received contents (the contents that the audio signal generating device 10 belonging to the same unit outputs), based on the acoustic characteristic that the radio receiving portion 31 received. The audio signal attaching portion 34 executes a masking sound attaching process of the received contents, based on the acoustic characteristic that the radio receiving portion 31 received. The acoustic process that are executed by the audio signal modifying portion 33 and the audio signal attaching portion 34 mentioned above will be described in detail later.

The D/A converter 35 converts the audio signal that has been subjected to the acoustic process by the audio signal modifying portion 33 and the audio signal attaching portion 34 into an analog signal.

The outputting portion 36 outputs the audio signal being converted by the D/A converter 35 to the speaker 400 provided to the hall 200.

With the above, a hardware configuration of the audio signal processing device 30 is given.

Next, the acoustic process that the audio signal processing device 30 applies to the contents will be explained hereunder. Here, the process that the audio signal processing device 30A applies to the contents A will be explained hereunder. In this case, the acoustic processes that the audio signal processing devices 30B and 30C execute are similar to the process that the audio signal processing device 30A executes, and thus its explanation will be omitted herein.

In the present embodiment, there are three types of (1) the adjustment of the sound volume level, (2) the adjustment of the frequency characteristic, and (3) the attachment of the masking sound as the acoustic process that the audio signal processing device 30 executes.

First, (1) the adjustment of the sound volume level will be explained hereunder. The adjustment of the sound volume level of the contents A is made when a time period during which the contents A are non-silent and any of the contents (contents B and C) except the contents A is silent is sensed. Here, the term "silent" denotes a state that the sound volume level is below a predetermined specified value Vo in excess of a predetermined time period, while the term "non-silent" denotes states except for the silent state.

Figure 6A:
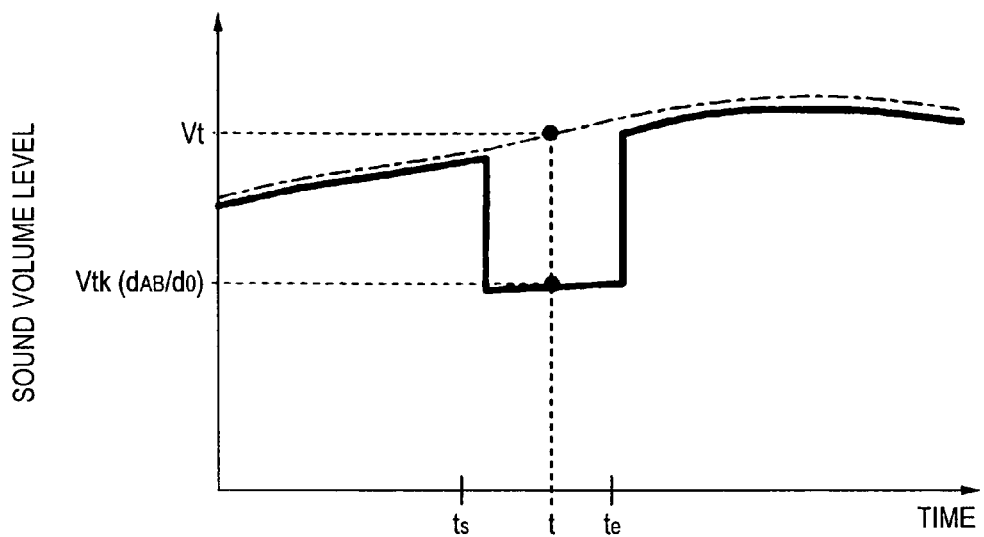
FIGS. 6A and 6B are views explaining a sound volume level adjusting process.

FIG. 6A is a graph showing a time-dependent change of a sound volume level at a certain time of the contents A. A graph indicated by a dot-dash line indicates a sound volume level of the contents A before the acoustic process is applied.

First, the audio signal modifying portion 33A decides whether or not the silent period is present in the contents B and C. Here, suppose that the contents B is silent from a time ts to a time te. The audio signal modifying portion 33A adjusts the sound volume level such that a sound volume level obtained by multiplying the sound volume level prior to the process by a coefficient k is produced at a time ts from which the silent period is started.

Figure 6B:
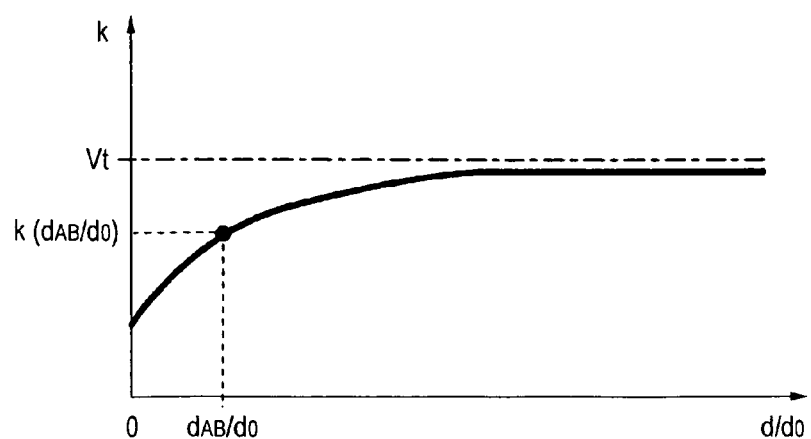

FIG. 6B is a graph showing schematically a value of the coefficient k with respect to d/d0. Here, d0 is a constant expressed in units of m (meter). In the present embodiment, a distance at which a predetermined sound volume of the contents is reduced by half in the hall 200 is set as d0. Also, d is a distance (m) between the speaker 400A and the speaker 400 that reproduces the contents from which the silent period is sensed. In FIG. 6B, dAB denotes a distance between the speaker 400A and the speaker 400B. As shown in FIG. 6B, the coefficient k is a function that has a positive correlation with a value of d/d0 and a value of which comes gradually close to 1 as a value of d is increased. The function of the coefficient k and the constant d0 are given as an example, and the present invention is not limited to the above function and the above values. In short, any function and value may be employed if the coefficient k may have a higher value as the value d is increased larger.

The sound volume level of the contents A is adjusted to the value obtained by multiplying the sound volume level prior to the process by the coefficient k (dAB/d0) while the contents B is silent.

When the silent period of the contents B is terminated at the time te, the audio signal modifying portion 33A terminates the sound volume level adjusting process and then restores the sound volume level of the contents A to the sound volume level prior to the process.

Because the sound volume level is adjusted as described above, the contents A is adjusted to the sound volume level indicated by a solid line in FIG. 6A.

In this case, the user can change appropriately settings of the function of the coefficient k and the constant d0 in light of the acoustic characteristic of the hall 200, etc.

As described above, when the certain contents are silent, sound volume levels of the surrounding contents, especially the contents that are being reproduced in the neighboring area, are suppressed by applying a weighting that has a negative correlation with a distance. As a result, such a situation can be suppressed that the listener of the silent contents turns his or her attention to the surrounding contents.

Then, (2) the adjustment of the frequency characteristic will be explained hereunder.

The audio signal modifying portion 33 has the so-called equalizer function, and executes an adjustment of the frequency characteristics. Here, the "adjustment of the frequency characteristics" is to reduce a sound pressure of a predetermined frequency band component (which belongs to the band that shows a strong tendency to leak out to the surrounding area or the band that is liable to attract human being's attention, for example) of the audio signal as the processed object.

Also, the audio signal modifying portion 33 executes the process to bring frequency characteristics of respective contents closer mutually, in addition to a reduction of the above frequency band component. The audio signal modifying portion 33 compares the frequency characteristics contained in the acoustic characteristics of the received contents with each other, and executes the adjustment of the frequency characteristics in such a way that these frequency characteristics become analogous to each other among the contents.

According to this adjustment of the frequency characteristics, the contents that are apt to exert an influence on the listening of other contents that are emitted simultaneously can be modified into the contents having the characteristics that are hard to exert an influence on other areas.

Then, (3) the attachment of the masking sound will be explained hereunder. Such a phenomenon is known that, when another sound (masking sound) having a frequency that is close to the noise is present while the person hears the noise, it is difficult for this person to listen that noise. This phenomenon is normally called a masking effect. It is known that, a masking effect becomes conspicuous as a frequency of the masking sound becomes closer to the noise and a sound volume level of the masking sound is relatively higher than a sound volume level of the noise. In the present embodiment, the influence of the contents that the listener hears from other areas is suppressed by utilizing this masking effect.

Figure 7A:
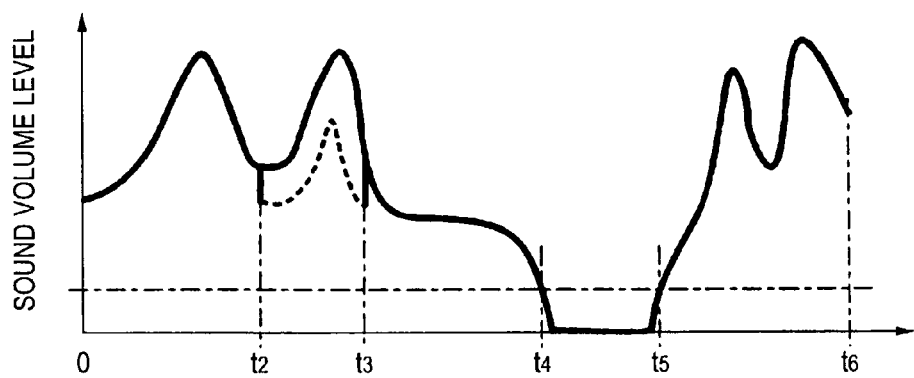
FIGS. 7A to 7C are graphs showing schematically sound volume levels of a plurality of contents in a certain time zone.
Figure 7B:
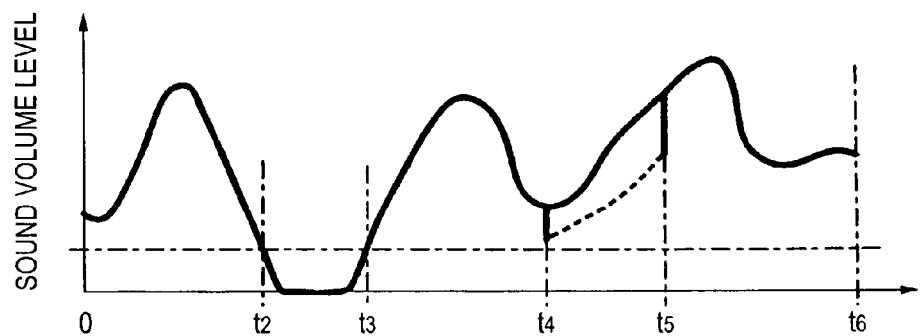
Figure 7C:
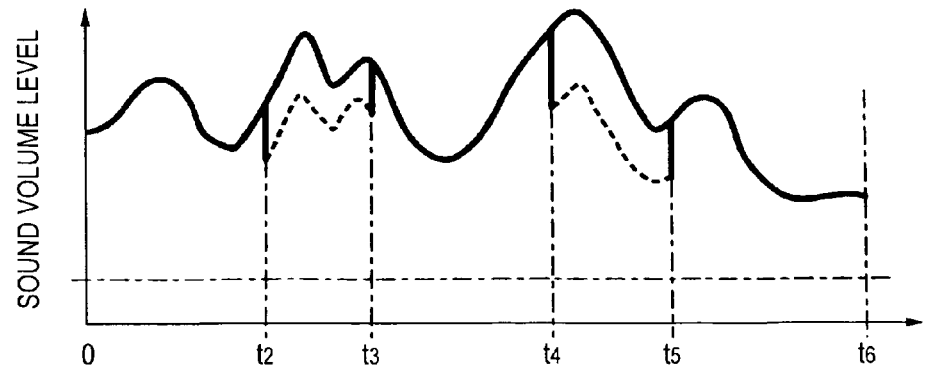

The masking sound attaching process applied to the contents A is executed when a time period during which the contents A are silent is sensed. Explanation will be made by using the sound volume level of the contents A shown in FIG. 7A. Here, the sound volume levels sensed by the sound analyzing circuit 22 are shown in FIGS. 7A to 7C.

First, the audio signal modifying portion 33A decides whether or not the silent period exists in the contents A. When a portion of the contents A in which the sound volume level is silent is sensed, the audio signal attaching portion 34A executes following processes. The audio signal attaching portion 34A senses a start time and an end time of the silent period of the contents A. Since the contents A is silent from a time t4 to a time t5, the contents A and the masking sound are reproduced at a previously determined constant sound volume in the period.

Here, a sound volume of the masking sound to be attached is adjusted to a previously set value by the administrator of the audio signal processing system 1. In this case, the sound volume may be set in view of the sound volume of the contents that is being reproduced around the (silent) contents A and the distance between the speaker 400 used to reproduce the contents and the speaker 400A. Also, a measuring section (not shown) for measuring the sound volume level of the noise may be provided actually to the table 500A, then the sound volume of the noise caused actually may be measured by the measuring section, and then the sound volume of the masking sound may be adjusted based on the measured result.

As the result that above processes are applied to the contents A, the masking sound as well as the contents A is reproduced when the contents A locates at its silent portion. As a result, such a situation can be suppressed that the listener of that contents turns his or her attention to the noise caused in other areas.

Meanwhile, the masking sound used in the present embodiment is a murmuring sound of river, or the like. A sound source is stored previously in the audio signal processing device 30 by the administrator of the audio signal processing system 1, or the like.

In this case, as the kind of the masking sound, the commercial of the hall 200, the BGM (background music), and the like may be used in addition to the murmuring sound of river. In short, any sound may be used if such sound makes it hard for the listener to hear other contents being leaked out by the masking effect.

(A-2: Operation of First Embodiment)

Next, an operation of the audio signal processing system 1 will be explained hereunder. Here, the case where the sounds are emitted simultaneously from the contents A, B, and C in the hall 200 and also the acoustic process is applied in parallel to the contents A, B, and C in the units A, B, and C respectively to reproduce the sound will be explained in the following. In the following explanation, only the acoustic process that the unit A applies to the contents A is picked up by way of example. Since the contents B and C are similar to the contents A, their explanation will be omitted herein.

Figure 8:
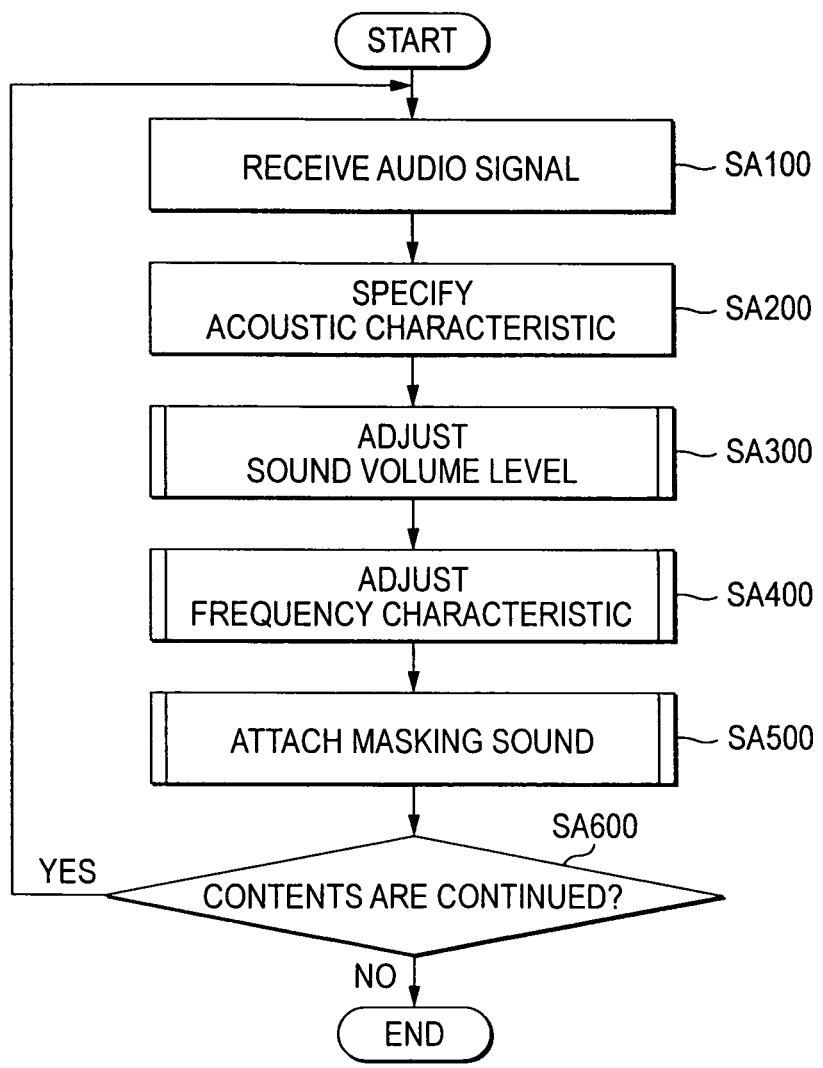
FIG. 8 is a flowchart showing procedures of an acoustic process executed by the audio signal processing device 30.

FIG. 8 is a flowchart showing the acoustic process that the audio signal processing system 1 executes. First, the audio signal generating device 10A outputs the audio signal. The receiving portion 25 of the acoustic characteristic sensing device 20A receives the output audio signal (SA100), and outputs the audio signal to the signal processing/delaying circuit 21A and the sound analyzing circuit 22A. The sound analyzing circuit 22A specifies the acoustic characteristic (the sound volume level and the frequency characteristic) of the audio signal (SA200). Then, the contents identifier attaching portion 23A attaches a contents identifier to the audio signal whose acoustic characteristic was sensed. The signal generated in such way is transmitted into the hall 200 as a radio wave by the radio transmitting portion 24A. The transmitted radio wave of the contents A arrives at the neighboring audio signal processing devices 30A, 30B, and 30C.

The radio receiving portion 31A receives the signal from the radio transmitting portion 24A. In the audio signal processing system 1 shown in FIG. 1, the radio receiving portion 31A receives the signals emitted from the radio transmitting portions 24A, 24B, and 24C. The radio receiving portion 31A discriminates the contents identifier contained in the received signal to decide whether or not the received signal belongs to the contents A. The radio receiving portion 31A, when decided that the received signal belongs to the contents A, receives all information (the audio signal, the acoustic characteristic, and the contents identifier) contained in the received signal. In contrast, the radio receiving portion 31A, when decided that the received signal does not belong to the contents A, receives only the acoustic characteristic and the contents identifier. In the present operational example, the radio receiving portion 31A receives the audio signal, the acoustic characteristic, and the contents identifier of the contents A, and the acoustic characteristics and the contents identifiers of the contents B and C.

The radio receiving portion 31A receives the above signals, and outputs the data to the audio signal modifying portion 33A and the audio signal attaching portion 34A. Based on the data about the distances between the speaker 400A and other speakers 400 received via the distance information inputting portion 32A, and the audio signal of the contents A and the acoustic characteristics of the contents A, B, and C, the audio signal modifying portion 33A and the audio signal attaching portion 34A applies the processes subsequent to step SA300, i.e., adjustment of the sound volume level (step SA300), adjustment of the frequency characteristic (step SA400), and attachment of the masking sound (step SA500), to the contents A. After the audio signal processing device 30 completes three types of acoustic characteristics, it decides whether or not the contents A are continued (step SA600). If the contents A are continued, the decision result in step SA600 goes to "Yes". Then, the processes subsequent to step SA100 are applied to the continued part of the contents A. In contrast, if the contents A are ended, the decision result in step SA600 goes to "No". Then, the unit A ends the process.

The acoustic processes in steps SA300, 400, and 500 will be explained concretely by taking the contents A, B, and C shown in FIGS. 7A to 7C as an example. The graphs shown in FIGS. 7A to 7C indicate the sound volume levels of the contents A, B, and C (referred to as vA, vB, and vC respectively hereinafter) from a time 0 to a time t6. In FIGS. 7A to 7C, a solid line indicates a sound volume level sensed by the sound analyzing circuit 22, and a broken line indicates a specified value Vo as the criterion to decide whether the sound volume level is non-silent or silent. Since the sound volume level of the contents A is below a specified value Vo from a time t4 to a time t5 and the contents B is below a specified value Vo from a time t2 to a time t3 and also these time periods exceed a predetermined time period respectively, it is decided that the contents A and B are silent for these time periods respectively.

Figure 10:
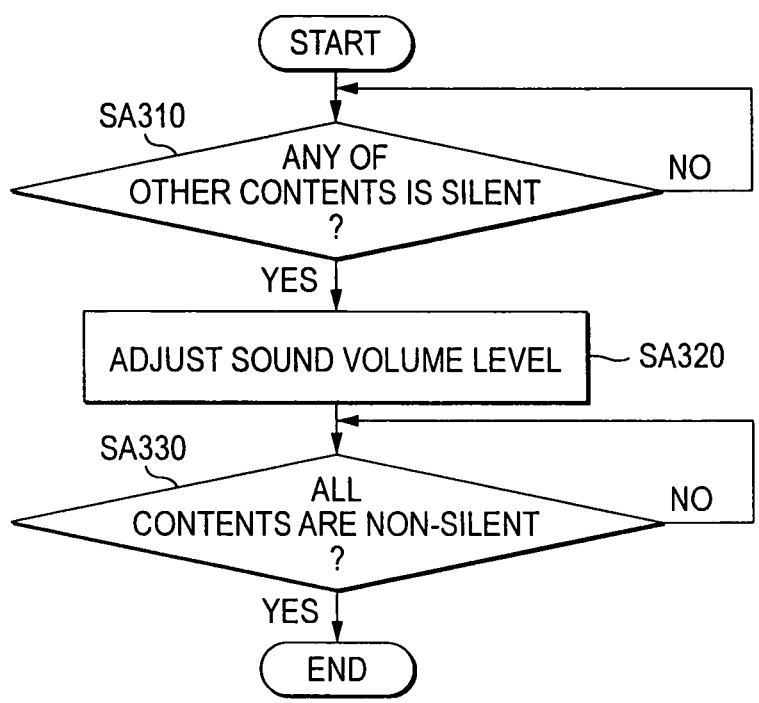
FIG. 10 is a flowchart showing procedures of a sound volume level adjusting process executed by the audio signal processing device 30.

At first, the sound volume level adjusting process in step AS300 will be explained hereunder. FIG. 10 is a flowchart showing a flow of process when the audio signal modifying portion 33 makes an adjustment of the sound volume level. The audio signal modifying portion 33A decides whether or not the silent portion such as an interval between the music pieces is present in the contents B or C (step AS310), based on the received acoustic characteristics. This step AS310 is repeated while the decision result in step AS310 goes to "No". If the silent portion is sensed from the contents B or C, the decision result in step AS310 goes to "Yes", and then the process goes to step AS320. In FIGS. 7A to 7C, both the contents B and C are non-silent from a time 0 to a time t2, and thus the decision result in step AS310 goes to "No". Since it is decided that the contents B are silent from a time t2 to a time t3, the decision result in step AS310 goes to "Yes".

Then, in step AS320, the audio signal modifying portion 33 adjusts the sound volume level of the contents A to vA*k (dAB/do) from a time t2 to a time t3. Then, in step AS330, the audio signal modifying portion 33 decides whether or not the silent period of the silent contents (in this case, the contents B) is terminated and that contents are non-silent. If the contents B are still silent, the decision result in step AS330 goes to "No", and then the sound volume level of the contents A is still suppressed low. If the contents B are non-silent, the decision result in step AS330 goes to "Yes", and then the audio signal modifying portion 33 terminates the sound volume level adjusting process. Then, the sound volume level of the contents A is restored to the proper level.

After a time t3, since the silent portion is not present in the contents B and C, the decision result in step AS310 goes to "No". Thus, the sound volume level adjusting process is not executed.

As the result that the adjustment of the sound volume level explained as above has been made, the audio signal of the contents A showing the sound volume level indicated by a broken line in FIG. 7A is generated. As a result, when the silent portion exists in the contents, the sound volume levels of the contents reproduced in the surroundings are suppressed low.

Next, the adjustment of the frequency characteristic in step SA400 will be explained hereunder.

The audio signal modifying portion 33A reduces a sound pressure of a low frequency band component that shows a strong tendency to leak out to the surrounding area or the band that is liable to attract human being's attention of the audio signal of the contents A received from the radio receiving portion 31A. Also, the audio signal modifying portion 33A executes the process to bring the frequency characteristics of respective contents closer mutually, in addition to a reduction of the particular frequency band component. That is, the audio signal modifying portion 33A refers to the frequency characteristics contained in the acoustic characteristics of the contents except for the contents A that the radio receiving portion 31A received, and makes the adjustment of the frequency characteristic such that the frequency characteristic of the contents A becomes analogous to these frequency characteristics.

Not only the contents that have been subjected to the adjustment of the frequency characteristic have a nature that is hard to leak out to the surrounding area, but also the contents even when leaked out are processed to have the acoustic characteristic that shows a weak tendency to attract human being's attention. As a result, such a situation can be suppressed that the listener in the surrounding area turns his or her attention away from the contents emitted in that area because of the presence of the contents that have been subjected to the present process.

Finally, the masking sound attaching process in step SA500 will be explained with reference to FIG. 11 hereunder.

Figure 11:
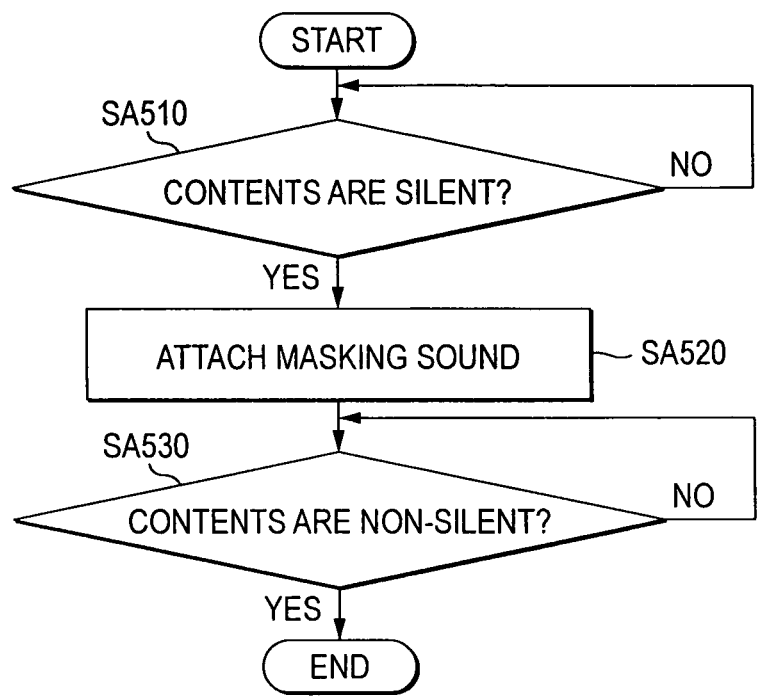
FIG. 11 is a flowchart showing procedures of a masking sound attaching process executed by the audio signal processing device 30 in a first embodiment.

FIG. 11 is a flowchart showing a flow of the masking sound attaching process that the audio signal attaching portion 34 applies to the contents. First, the audio signal attaching portion 34A decides whether or not the silent portion is present in the contents A, based on the acoustic characteristic of the contents A (step SA510). If the silent portion is sensed, the decision result in step SA510 goes to "Yes", and then the process goes to step SA520. In contrast, if the silent portion is not sensed, the process in step SA510 is repeated. In step SA520, the audio signal attaching portion 34A attaches the masking sound subsequent to that silent period.

In FIGS. 7A to 7C, since the contents A are non-silent from a time 0 to a time t4, the decision result in step SA510 goes to "No" in this time period. Then, the process in step SA510 is repeated. Since it is sensed at a time t4 that the contents A goes to the silent state, the decision result in step SA510 goes to "Yes", and then the process goes to step SA520. In step SA520, the audio signal attaching portion 34A attaches the masking sound to the contents A from a time t4.

Then, in step SA530, the audio signal attaching portion 34A decides whether or not the silent period of the contents A is terminated and the contents A are non-silent. If the silent period is still continued, the decision result in step SA530 goes to "No", and then the audio signal attaching portion 34A continues to attach the masking sound at a predetermined sound volume. In contrast, if the silent period is terminated, the decision result in step SA530 goes to "Yes", and then the process is ended. The audio signal attaching portion 34A does not attach the masking sound after the time at which the silent period of the contents A is terminated.

In FIGS. 7A to 7C, since the contents A is continuously silent from a time t4 to a time t5, the decision result in step SA530 goes to "No", and then the attachment of the masking sound is continued. At a time t5, since the silent period is terminated, the decision result in step SA530 goes to "Yes", and then the sound volume level of the masking sound is kept up to a time t5. Then, the process is ended.

With the above, the operation of the acoustic process that is applied to the contents A by the unit A is given. The first embodiment can achieve the advantage that, because respective contents are subjected to the acoustic process explained as above, such a situation can be suppressed that an attention of the listener of the contents is diverted by the contents leaked out from other areas in a period during which the contents directed to the listener himself or herself are silent.

B: Second Embodiment

A second embodiment of the present invention will be explained hereunder.
(B-1: Configuration of Second Embodiment)

A hardware configuration of the second embodiment is similar to that of the first embodiment, and thus their explanation will be omitted herein. However, since contents of the acoustic process executed by a software module of the audio signal processing device 30 are different, this difference will be explained in the following.

As the acoustic process applied to the contents in the second embodiment, there are three types of (1) the adjustment of the sound volume level, (2) the adjustment of the frequency characteristic, and (3) the attachment of the masking sound. But the contents of the acoustic process are different from the first embodiment.

In the following, like the explanation in the first embodiment, the acoustic process applied to the contents A by the unit A will be explained hereunder. Since the acoustic process applied to the contents B and C are similar to the process applied to the contents A, their explanation will be omitted herein.

First, (1) the adjustment of the sound volume level will be explained. The adjustment of the sound volume level made by the audio signal processing device 30A is executed in a period during which all contents the signals of which the radio receiving portion 31A received are non-silent.

The audio signal modifying portion 33A refers to the acoustic characteristics of respective contents, and senses the sound volume levels at each time (here, the sound volume levels of the contents A, B, and C at a time t are represented as vAt, vBt, and vCt respectively). Then, the audio signal modifying portion 33A calculates ΔvAt=Xt−vAt, which is a difference between a mean value Xt (Xt=(vAt+vBt+vCt)/3) of vAt, vBt, and vCt and vAt, and adjusts the sound volume level of the contents A to a value (vAt*) given by (Formula 1) as follows.

$$vAt^* = Xt + \alpha \Delta vAt \quad \text{(Formula 1)}$$

where α is a coefficient to satisfy 0<α<1. The administrator of the audio signal processing system 1 can set this value appropriately. In the present embodiment, α=0.5 is set.

Since the audio signal modifying portion 33A adjusts the sound volume level of the contents A in this manner, the sound volume level of the contents A is adjusted to a value that is close to a mean value of the sound volume levels of the contents A and the contents reproduces around the table 500A. In other words, the sound volume level of the contents whose sound volume level is higher than the mean value is pulled down whereas the sound volume level of the contents whose sound volume level is lower than the mean value is pulled up.

Then, (2) the adjustment of the frequency characteristic is similar to that in the first embodiment except that such adjustment is executed in a period during which all contents the signals of which the radio receiving portion 31A received are non-silent. Therefore, its explanation will be omitted herein.

Then, (3) the attachment of the masking sound will be explained hereunder. In the first embodiment, the case where the noises caused by the contents in other area are cancelled by attaching the masking sound to the silent portion of the contents is explained. In the present embodiment, the case where, even though the contents A are non-silent, the noises caused by the contents in other area are masked by attaching the masking sound to the non-silent portion of the contents A will be explained hereunder.

First, the audio signal attaching portion 34A specifies a period during which the sound volume levels of all contents are non-silent, by referring to the acoustic characteristic that the radio receiving portion 31A received. The audio signal attaching portion 34A generates the masking sound that is attached to the contents A in the concerned period, as described later, and attaches the masking sound to the audio signal of the contents A.

The masking sound used in the present embodiment is a sound signal that is generated by changing the frequency characteristic of a white noise. In the following, a method of generating the masking sound will be explained with reference to FIGS. 9A to 9D.

Figure 9A:
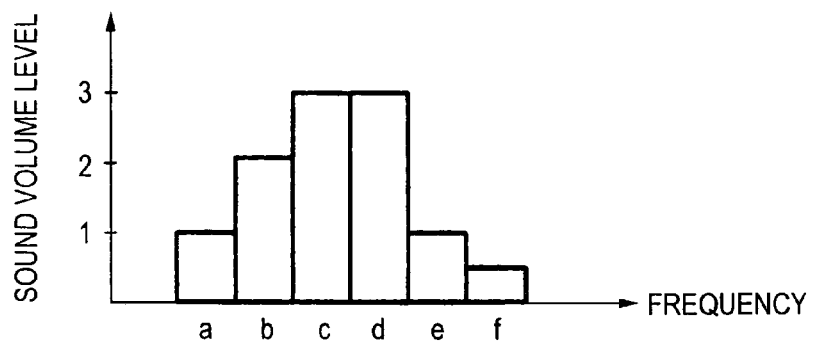
FIGS. 9A to 9D are views explaining a masking sound generating method.
Figure 9B:
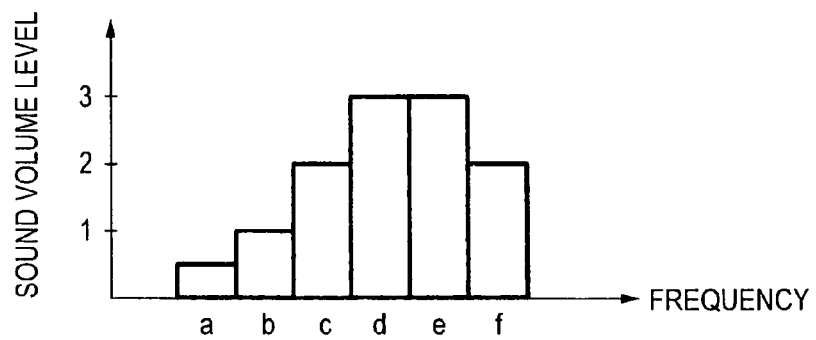
Figure 9C:
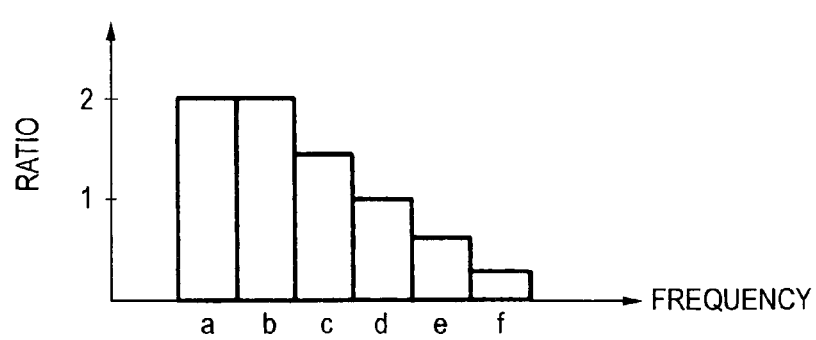
Figure 9D:
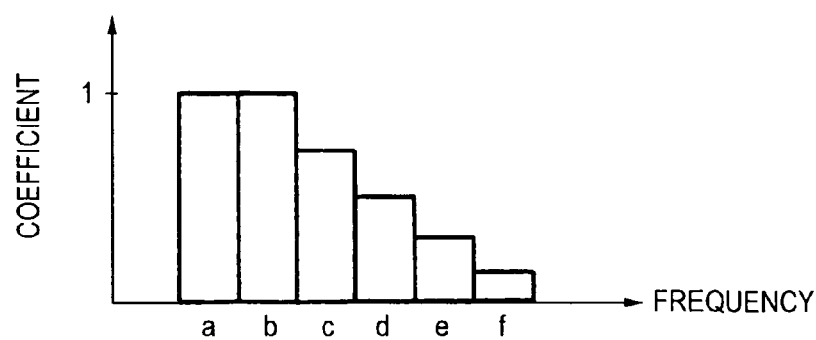

In FIG. 9A, the sound volume level of the noise generated around the table A by the contents in other areas (in this case, the contents B and C) at a certain time is shown every frequency band. In FIG. 9B, the sound volume level of the contents A at the same time as that in FIG. 9A is shown every frequency band. The audio signal attaching portion 34A calculates a value of a ratio of (sound volume level of the noise)/(sound volume level of the contents) every frequency band. A graph showing a value of the calculated ratio every frequency band is given in FIG. 9C. Then, the audio signal attaching portion 34A normalizes the value of the ratio every frequency band such that its maximum value is 1. That is, the values of the ratios in all frequency bands are divided by the value in the frequency bands (in this case, a and b) showing a maximum value (in this case, 2). A graph showing such calculated values every frequency band is given in FIG. 9D. The sound signal obtained by using the values in the graph at respective frequencies as "coefficients" in the frequency bands and then multiplying the white noises having the sound volume decided in advance by the administrator in respective frequency bands by the above coefficients is used as the masking sound in the present invention. The masking sound being set in such a manner has the frequency characteristic suitable for the sound that not masks the contents in the listener's own area but masks effectively the noise caused by the contents in other areas.

As the result of the foregoing process, when all contents the acoustic characteristic of which were received correspond to the non-silent portion, the masking sound as well as the contents A is reproduced. As a result, such a situation can be suppressed that the listener of the contents turns his or her attention to the noises generated from other areas.

Here, the masking sound is not limited to the sound signal generated as above, and the sound produced artificially by another method or the environmental sound being recorded may be employed alternately. In this case, the environmental sound recorded previously in the hall 200 or other locations may be employed. Otherwise, the environmental sound of the hall 200 may be recorded by a separately provided recording device (not shown) while the contents are being reproduced, and then may be used as the masking sound.

(B-2: Operation of Second Embodiment)

An operation of the audio signal processing system 1 according to the present invention will be explained hereunder. In the present operational example, like the first embodiment, the audio signal processing system 1 executes the acoustic processes of respective contents in compliance with a flowchart shown in FIG. 8. In the present operational example, since the process contents in steps SA300 to SA500 in the flowchart are different from those in the operational example in the first embodiment, steps SA300 to SA500 will be explained mainly hereunder.

Also, the acoustic process applied to the contents A by the audio signal processing device 30A will be explained hereunder. But the acoustic processes applied to the contents B and C are carried out similarly by the units B and C.

Figure 12A:
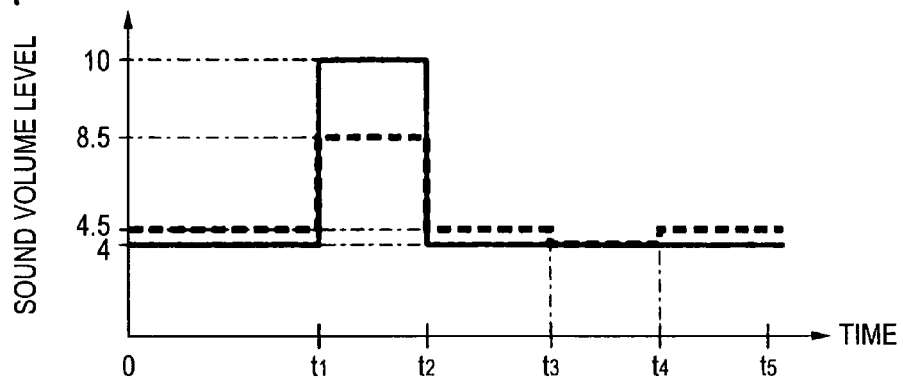
FIGS. 12A to 12C are graphs showing schematically sound volume levels of a plurality of contents in a certain time zone.
Figure 12B:
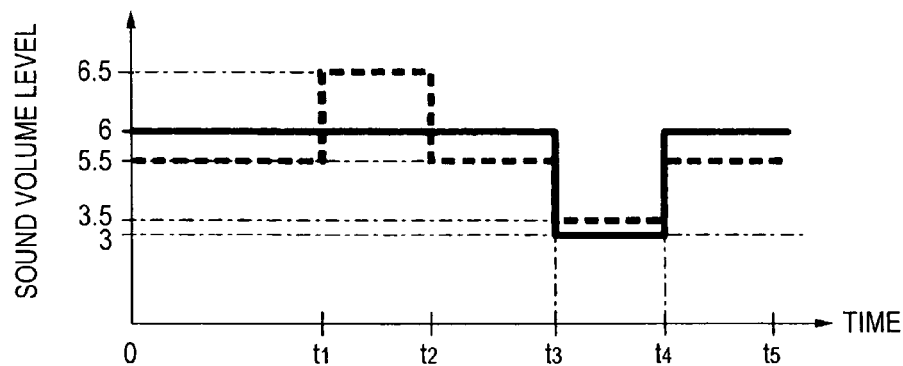
Figure 12C:
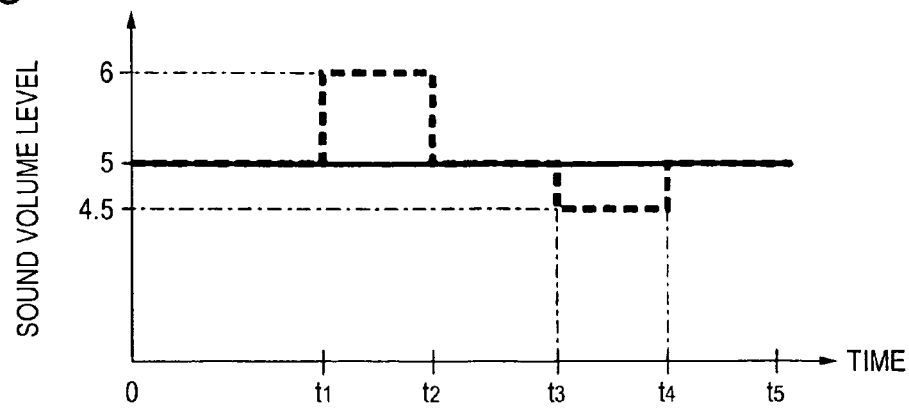

Graphs given in FIGS. 12A to 12C show the sound volume levels of the contents A, B, and C respectively. An ordinate denotes the sound volume level of the contents, and an abscissa denotes a time (time elapsed from a start of reproduction of the contents). In FIGS. 12A to 12C, a solid line indicates the sound volume level sensed from the audio signal prior to the acoustic process, and a broken line indicates the sound volume level after the acoustic process.

As shown in FIG. 12A, the sound volume level of the contents A prior to the acoustic process shows vA=4 from a time 0 to a time t1 and a time t2 to a time t5, and shows vA=10 from a time t1 to a time t2. The sound volume level of the contents B shows vB=6 from a time 0 to a time t3 and a time t4 to a time t5, and shows vB=3 from a time t3 to a time t4. Also, the sound volume level of the contents C shows vC=5 constantly from a time 0 to a time t5.

Figure 16:
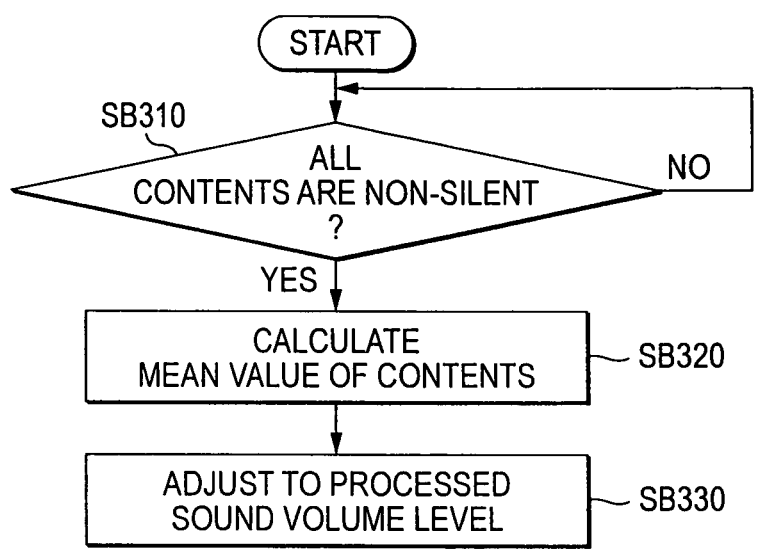
FIG. 16 is a flowchart showing procedures of a sound volume level adjusting process executed by the audio signal processing device 30.

First, the adjustment of the sound volume level in step SA300 will be explained hereunder. FIG. 16 is a flowchart showing procedures of the sound volume level adjusting process that the audio signal modifying portion 33 executes. First, the audio signal modifying portion 33A decides whether or not all sound volume levels of the received audio signals are non-silent (step SB310). In FIGS. 12A to 12C, since the sound volume levels of the contents A, B, and C are vA=4, vB=6, and vC=5 from a time 0 to a time t1 respectively, there is no "silent" contents. Thus, the decision result in step SB310 goes to "Yes", and then the process goes to step SB320. In contrast, if the decision result in step SB310 goes to "No", the process in step SB310 is repeated. Then, the audio signal modifying portion 33A calculates a mean value (in this case, X=5) of the sound volume levels of respective contents based on the received acoustic characteristic (step SB320). Then, the audio signal modifying portion 33A calculates the processed sound volume level of the contents A in compliance with (Formula 1), and adjusts the sound volume level to the calculated value (step SB330). As a result, the processed sound volume levels of the contents A, B, and C are calculated as vA*=4.5, vB*=5.5, and vC*=5 in this case.

Similarly, the sound volume levels of the contents A, B, and C are vA=10, vB=6, and vC=5 from a time t1 to a time t2 respectively, and their mean value is 7. As a result, the processed sound volume levels of the contents A, B, and C are vA*=8.5, vB*=6.5, and vC*=6. After a time t2, similarly the adjustment of the sound volume level of the contents is made by the procedures explained above, and the audio signal having the sound volume level indicated by a broken line in FIGS. 12A to 12C is generated.

As explained above, for example, like the acoustic process executed from a time t1 to a time t2, when the sound volume level of the contents A is increased excessively highly but the sound volume levels of the contents B and C are not changed, the sound volume level of the contents A is not so increased higher than the sound volume level prior to the process, nevertheless the noises leaked out from other areas can be reduced. In contrast, the sound volume levels of the contents B and C can be adjusted still high. As a result, the listeners of the contents B and C never turn their attention to the noise derived from the contents A that exhibit the high sound volume level, and can listen the contents directed to the listeners themselves.

Then, the adjustment of the frequency characteristic in step SA400 is similar to that in the first embodiment except that such adjustment is executed in a period during which all contents the signals of which the radio receiving portion 31A received are non-silent. Therefore, its explanation will be omitted herein.

Figure 13:
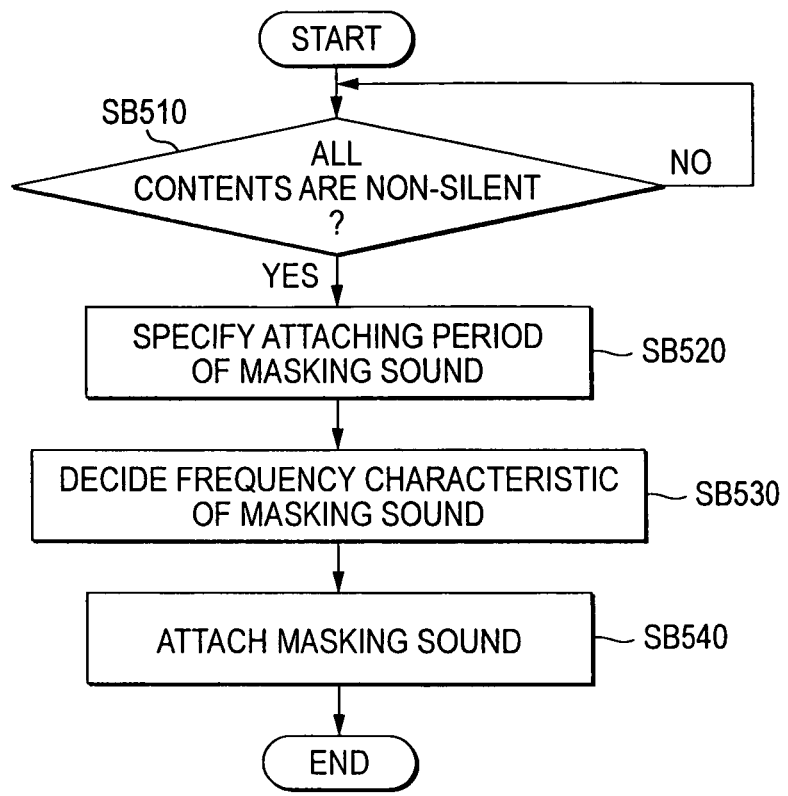
FIG. 13 is a flowchart showing procedures of a masking sound attaching process executed by the audio signal processing device 30 in a second embodiment.

Finally, the masking sound attaching process in step SA500 will be explained with reference to a flowchart in FIG. 13 hereunder. The audio signal attaching portion 34 decides whether or not a period during which all contents are non-silent is present (step SB510). If the decision result in step SB510 goes to "Yes", the audio signal attaching portion 34A specifies a period during which all contents are non-silent, based on the acoustic characteristics of respective contents (step SB520). In step SB530, the frequency characteristic of the masking sound that is attached to the contents A in this period is decided by the above procedures, based on the frequency characteristics of the contents A, B, and C. Then, the masking sound is attached to the concerned portion of the contents A (step SB540). In step SB510, if a period during which all contents are non-silent is not present, the decision result in step SB510 goes to "No", and thus the processes subsequent to step SB520 are not executed.

The foregoing operations will be explained concretely about the contents A, B, and C shown in FIGS. 7A to 7C hereunder. Since the sound volume levels of the contents (the contents A, B, and C) that the audio signal processing device 30A received from a time t0 to a time t2 are non-silent, the decision result in step SB510 in this period goes to "Yes", and thus the audio signal attaching portion 34A decodes a period from a time t0 to a time t2 as a period during which all contents are non-silent (step SB520). Then, the audio signal attaching portion 34A generates the masking sound having the acoustic characteristic that does not mask the contents A but mask the contents except the contents A by the above method (step SB530), and attaches the generated masking sound to the audio signal of the contents A at that time (step SB540).

In FIGS. 7A to 7C, since the contents B and the contents A have a silent period from a time t2 to a time t3 and from a time t4 to a time t5 respectively, the decision result in step SB510 goes to "No". Thus, the masking sound attaching process is not applied to the contents A in that period.

Also, since all contents are non-silent from a time t3 to a time t4 and from a time t5 to a time t6, the masking sound attaching process is applied to the contents A by the similar procedures to those in the process executed from a time t0 a time t2.

(Variations)

With the above, embodiments of the present invention are explained. But the present invention can be carried out in various modes given as follows. Also, it is of course that following modes can be employed in combination.

(1) The process that the audio signal processing device 30 executes in a period during which any of the received contents is silent is described in the first embodiment, and the process that the audio signal processing device 30 executes in a period during which all contents are non-silent is described in the second embodiment. In this case, the processes given in both embodiments may be employed together.

(2) In the above embodiments, the sound volume levels are sensed from the audio signals of respective contents, and then the control is executed based on the sensed sound volume levels. However, in a situation that the listener can get a time code in which chapter information of the contents are described, or the like, when such listener can know previously at what timing the silent portion of the contents appears by a time cord acquiring section (not shown) provided to the audio signal processing device 30, the control may be executed based on that information.

(3) The case where the masking sound such as a murmuring sound of river, or the like is employed is explained in the first embodiment, while the case where the masking sound obtained by modifying a while noise is employed is explained in the second embodiment. But the opposite combination may be employed as the types of the employed sound, and the masking sound and the masking noise may be employed together.

(4) The active noise control sound may be attached together with the masking sound or in place of the masking sound. The active noise control sound is an opposite phase sound with an amplitude of a sound pressure which is equal to that of the noise, and has the characteristic of reducing the noise by mutual interference. Unlike the noise canceling technology utilizing the sound absorbing phenomenon, the resonance phenomenon, or the like in the prior art, this active noise control sound cancels actively the noise. In such case, the audio signal attaching portion 34 may attach the audio signal of the active noise control sound to the contents in a period during which the masking sound is attached.

Concretely, the audio signal attaching portion 34 generates the audio signal of the active noise control sound as the sound whose phase is opposite to the sound contents that are generated by synthesizing the audio signals output from the audio signal generating devices 10 in other units. This generated audio signal is synthesized with the audio signal in the silent portion of the contents, and a resultant signal is reproduced. As a result, the noise caused by the contents in other areas are cancelled positively, so that such a situation is suppressed that the listener is caused to turn his or her attention away from the contents directed to the listener himself or herself.

(5) In the above embodiments, the case where ON/OFF of the masking sound is controlled such that the sound volume level of the masking sound is shaped into a rectangular wave is explained. Also, the case where the sound volume level of the contents as the processed object is changed discontinuously at a start and an end of the processing interval in the sound volume level adjusting process is explained. However, in controlling ON/OFF of the masking sound or adjusting the sound volume level, a fade-in/fade-out effect may be added to the sound volume level of the masking sound or the contents.

(6) In the above embodiments, the case where the audio signal processing device 30 can execute entirely a plurality of acoustic processes and all the processes are executed sequentially is explained. However, a part of these acoustic processes may be executed as the acoustic process. For example, even when the audio signal processing device 30 executes merely the sound volume level adjusting process of the contents, such an effect can be achieved sufficiently that the contents exert an influence upon other areas.

(7) In the above embodiments, the case where the audio signal of the masking sound is synthesized with the audio signal of the silent contents, and then a resultant audio signal is reproduced from the same speaker is explained. But respective audio signals may be reproduced from individual speakers provided closely without synthesis of the audio signals.

(8) In the above embodiments, the masking sound is superposed on the silent portion or the non-silent portion of the contents in the masking sound attaching process. However, the sound volume level of the masking sound may be controlled continuously together with the sound volume level of the contents, without selection of the portion of the contents on which the masking sound is superposed. Concretely, the sound volume level of the masking sound may be controlled to have a negative correlation with the sound volume level of the contents in such a manner that, when the sound volume level of the contents is low, the sound volume level of the masking sound is increased.

(9) In the above embodiments, the sound volume level of the contents is compared with the specified value every point of time, and then various acoustic processes are executed based on the compared result. But the contents may be divided into a plurality intervals and a mean value of the sound volume level of the contents may be calculated every interval, and then the mean value may be compared with the specified value and the acoustic process may be executed based on the compared result.

Figure 14:
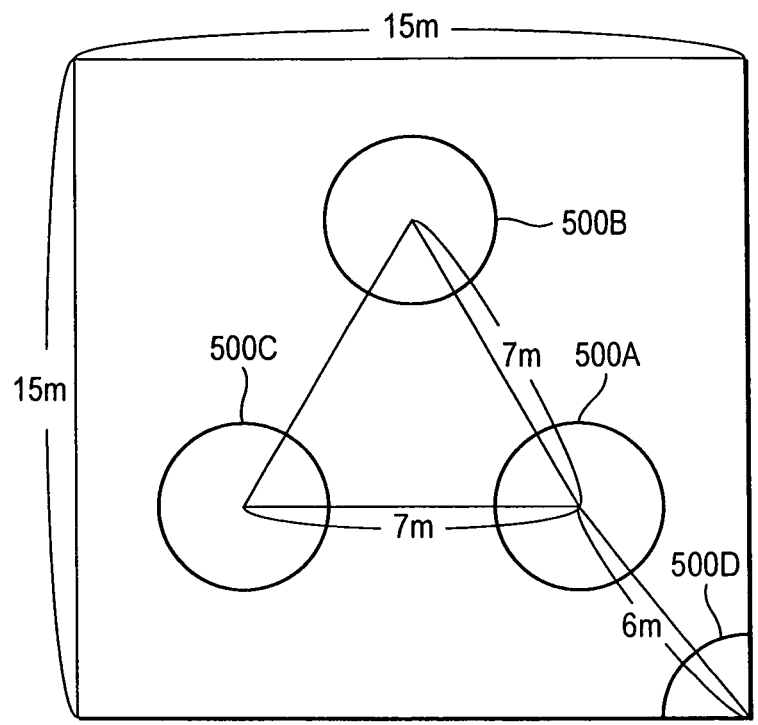
FIG. 14 is a block diagram showing an example of an arrangement of tables 500 in a hall 200.

(10) In the above embodiments, the case where the speakers 400A, 400B, and 400C are arranged at a short distance (7 m) in the hall 200 is explained. Therefore, the radio wave transmitted from the radio transmitting portion 24 can be received by the audio signal processing devices 30 in all units. However, for example, as shown in FIG. 14, when the audio signal processing system 1 is constructed by providing a unit D having the similar configuration to the units A, B, C to a sectoral table D that is placed at a corner of the hall 200, points to be changed in the above acoustic distances arise as follows because the acoustic distance exceeds an effective range of a radio wave depending on a combination of tables.

More particularly, the signal transmitted from a radio transmitting portion 24D is received only by the radio receiving portions 31A and 31D. Also, the radio receiving portion 31D receives only the signals transmitted from the radio transmitting portions 24A and 24D, but it does not receives the signals transmitted from the radio transmitting portions 24B and 24C. As a result, an audio signal processing device 30D executes the acoustic process based on the information about the contents A and D, and the audio signal processing device 30A executes the acoustic process based on the information about the contents A, B, C and D.

(11) In the first embodiment, the case where a particular sound source such as a murmuring sound of river, or the like is employed in the masking sound attaching process is explained. However, a function of selecting the masking sound having either the frequency characteristic of the contents in other areas or the frequency characteristic similar to a genre of the music piece from a plurality of masking sounds stored previously in a memory device may be provided to the audio signal attaching portion 34. Also, the administrator of the audio signal processing system 1 may change appropriately the type of the masking sound via an operation portion (not shown).

(12) In the second embodiment, a back ground noise measuring section (not shown) having a function that informs the audio signal modifying portion 33 or the audio signal attaching portion 34 of the back ground noise measured from the environment may be provided to the audio signal modifying portion 33, and then the processes listed in the following may be executed.

First, the sound volume levels of all contents are increased by a predetermined rate when the back ground noise due to the surrounding contents or the environmental noise is loud. Conversely, the sound volume levels of all contents are decreased by a predetermined rate when the back ground noise is small.

Second, in attaching the masking noise, the sound volume level of the masking noise is increased when the sound volume level of the surrounding back ground noise is low whereas the sound volume level of the masking noise is decreased when the sound volume level of the surrounding back ground noise is high.

(13) In the second embodiment, the adjustment of the sound volume levels is executed according to the expression given by (Formula 1), but of course the adjusting method is not limited to the expression in (Formula 1) and values of the parameters. In short, the adjustment may be executed such that a difference of the sound volume level between the contents prior to the process should be reduced. Also, in the above embodiments, the adjustment of the sound volume levels is executed such that a total sum of the sound volume levels of the audio signals is kept constant. In this case, a tolerance may be established to some extent in a total sum of the sound volume levels of the audio signals.

(14) In the above embodiments, the case where the speakers 400A, 400B, and 400C are arranged at an equal distance mutually in the hall 200 is explained. Therefore, an influence shown when the different distance is set every combination of the tables 400 is not considered. However, when three speakers 400 are used but they are arranged not to form a regular triangle or when four speakers 400 or more are arranged, distances between the speakers 400 are different every combination. In such case, the influence caused by the arrangement of respective speakers may be reflected on the acoustic processing method when the audio signal processing device 30 executes the acoustic process. Concretely, for example, in executing the adjustment of the sound volume level in the second embodiment, a weight may be given to the sound volume levels of respective contents in response to the distance between the speakers as follows.

As shown in FIG. 15A, the tables A, B, and C are arranged, and the sound volume levels of the contents A, B, and C emitted from the speakers provided to respective tables at a certain time are assumed as vA, vB, and vC respectively. Then, AB, AC, BC denote the distance between respective tables. Here, in the above-mentioned adjustment of the sound volume level, the audio signal processing device 30 executes the adjustment of the sound volume levels of respective contents in such a way that the sound volume level after the adjustment is specified by (Formula 2).

$$vA^* = vA + \alpha\{(-vA+vC)/AC + (-vA+vB)/AB\}$$

$$vB^* = vB + \alpha\{(-vB+vA)/AB + (-vB+vC)/BC\}$$

$$vC^* = vC + \alpha\{(-vC+vB)/BC + (-vC+vA)/AC\} \quad \text{(Formula 2)}$$

Then, $\alpha$ in (Formula 2) is a value that is set by the operator of the audio signal processing device 30 in response to individual situations. Here, $\alpha$ is set to 0.1.

Now, as shown in FIG. 15B, the case where the tables are arranged to give AB=1, AC=10, and BC=10 is considered. First, at a time t1, when the sound volume levels of all contents are 1, no change is generated in the sound volume level even after the sound volume levels are adjusted by the audio signal processing device 30. Then, at a time t2, when the sound volume level of the contents A is 10 and both the sound volume levels of the contents B and C are 1, the sound volume levels after the adjustment are calculated as vA*=9.01, vB*=1.9, vC*=1.09. Then, at a time t3, when the sound volume level of the contents C is 10 and both the sound volume levels of the contents A and B are 1, the sound volume levels after the adjustment are calculated as vA*=1.09, vB*=1.09, vC*=9.82. The results in the above are summed up in a table in FIG. 15C.

As given by (Formula 2), because the distances between respective speakers are reflected on the acoustic process, influences produced mutually by the contents in the distant areas can be treated lightly whereas influences produced mutually by the contents in the adjacent areas can be treated while giving a weight. Thus, the acoustic process can be performed more effectively. Here, (Formula 2) is merely an example, and other method may be employed if such method can give a weight to respective contents.

(15) A masking sound adjusting section (not shown) for changing the sound volume level and the frequency characteristic of the generated masking sound is provided to the audio signal processing device 30. Thus, the administrator of the audio signal processing system 1 can set appropriately any acoustic characteristic of the masking sound via the masking sound adjusting section.

(16) The audio signal generating device 10 is not limited a mobile audio device used in the above embodiments, and a sound inputting device such as a CD drive, a radio wave receiver of a radio, a microphone, or the like may be employed. In short, any device may be employed as the audio signal generating device 10 if such device can output the audio signal. Also, when the audio signal generating device 10 is constructed by the device such as the microphone, or the like for outputting the audio signal in an analog form, the audio signal may be converted into a digital form by an A/D converter, and then output into the acoustic characteristic sensing device 20.

(17) The acoustic characteristic sensing device 20 and the audio signal processing device 30 are constructed by a hardware module. However, respective functions attached to these devices may be implemented by a software module.

(18) Three types of acoustic processes shown in the above embodiments may be executed in order different from that shown in the embodiments, or a plurality of acoustic processes may be executed in parallel.

(19) In the above embodiments, the case where the sound analyzing circuit 22 generates an envelope of a curve showing the sound volume level and the envelope is used as the data of the sound volume level in the acoustic characteristic is explained. However, the method executed by the sound analyzing circuit 22 to sense the sound volume level is not limited to the above method, and the contents may be divided into a plurality of periods and then a mean value of the sound volume levels may be calculated every period. Of course, the sound volume level of the audio signal received from the receiving portion 25 may be used as the data of the acoustic characteristic as it is.

What is claimed is:

1. An audio signal processing system including audio signal reproducing devices which respectively reproduce different sound contents in a plurality of areas including a predetermined area, said audio signal processing system further comprising:
   a receiving section which receives a plurality of audio signals having the different sound contents respectively;
   a process period specifying section which specifies a silent period in other audio signals except a particular audio signal for reproducing a sound content in the predetermined area that are received by the receiving section, respectively;
   a sound volume level adjusting section which decreases a sound volume level of the particular audio signal, in a period specified by the process period specifying section as a silent period in any of the other audio signals; and
   an outputting section which outputs the particular audio signal whose sound volume level is adjusted by the sound volume level adjusting section, wherein
   the different sound contents respectively include a contents identifier, and
   the audio signal processing system further comprises an identifying section that discriminates whether the received sound content is reproduced in the predetermined area or areas other than the predetermined area.

2. The audio signal processing system according to claim 1, wherein
   the process period specifying section includes: a sound volume level sensing section which senses sound volume levels of the plurality of audio signals that are received by the receiving section; and
   a specifying section which specifies a period during which the sound volume level that is sensed by the sound volume level sensing section is below a predetermined level continuously in excess of a predetermined time, as the silent period.

3. The audio signal processing system according to claim 1, wherein
   the process period specifying section includes: a sound volume level sensing section which senses sound volume levels of the plurality of audio signals that is received by the receiving section; and
   a specifying section which specifies a period during which the sound volume level that is sensed by the sound volume level sensing section exceeds a predetermined level as the non-silent period.

4. The audio signal processing system according to claim 1, wherein the process period specifying section has a specifying section which receives data indicating silent periods attached to the plurality of audio signals, and specifies the silent periods of the plurality of audio signals from the data.

5. The audio signal processing system according to claim 1, wherein the process period specifying section has a specifying section which receives data indicating non-silent periods attached to the plurality of audio signals, and specifies the non-silent periods of the plurality of audio signals from the data.

6. The audio signal processing system according to claim 1, wherein
the audio signal generating section includes: a frequency characteristic sensing section which senses frequency characteristic of the other audio signals; and
a similar characteristic signal generating section which generates the second audio signal having a frequency characteristic that is similar to the frequency characteristic sensed by the frequency characteristic sensing section and that has a low similarity to the frequency characteristic of the particular audio signal.

7. The audio signal processing system according to claim 1, wherein the audio signal generating section generates the second audio signal whose phase is opposite to phases of the other audio signals.

8. The audio signal processing system according to claim 1, wherein
the process period specifying section includes: a sound volume level sensing section which senses sound volume levels of the plurality of audio signals that is received by the receiving section; and
a specifying section which specifies a period during which the sound volume level that is sensed by the sound volume level sensing section exceeds a predetermined level as the non-silent period.

9. The audio signal processing system according to claim 1, wherein the process period specifying section has a specifying section which receives data indicating non-silent periods attached to the plurality of audio signals, and specifies the non-silent periods of the plurality of audio signals from the data.

10. The audio signal processing system according to claim 1, wherein the plurality of audio signals received by the receiving section are radio audio signals and the radio audio signals respectively include an audio characteristic and content identifier.

11. An audio signal processing system including audio signal reproducing devices which respectively reproduce different sound contents in a plurality of areas including a predetermined area, said audio signal processing system further comprising:
a receiving section which receives a plurality of audio signals having the different sound contents respectively;
a process period specifying section which specifies a silent period in other audio signals except a particular audio signal for reproducing a sound content in the predetermined area that are received by the receiving section, respectively;
a frequency characteristic correcting section which executes either a process of removing a predetermined frequency band component from the particular audio signal or a process of correcting the particular audio signal into an audio signal having a frequency characteristic that is similar to the other audio signals, in a period specified by the process period specifying section as the silent period in any of the other audio signals; and
an outputting section which outputs the particular audio signal whose frequency characteristic is corrected by the frequency characteristic correcting section, wherein
the different sound contents respectively include a contents identifier, and
the audio signal processing system further comprises an identifying section that discriminates whether the received sound content is reproduced in the predetermined area or areas other than the predetermined area.

12. The audio signal processing system according to claim 11, wherein
the process period specifying section includes: a sound volume level sensing section which senses sound volume levels of the plurality of audio signals that are received by the receiving section; and
a specifying section which specifies a period during which the sound volume level that is sensed by the sound volume level sensing section is below a predetermined level continuously in excess of a predetermined time, as the silent period.

13. The audio signal processing system according to claim 11, wherein the process period specifying section has a specifying section which receives data indicating silent periods attached to the plurality of audio signals, and specifies the silent periods of the plurality of audio signals from the data.

14. The audio signal processing system according to claim 11, wherein the plurality of audio signals received by the receiving section are radio audio signals and the radio audio signals respectively include an audio characteristic and content identifier.

15. An audio signal processing system including audio signal reproducing devices which respectively reproduce different sound contents in a plurality of areas including a predetermined area, said audio signal processing system further comprising:
a receiving section which receives a plurality of audio signals having the different sound contents respectively;
a process period specifying section which specifies a silent period in a particular audio signal received by the receiving section;
an audio signal generating section which generates a second audio signal with respect to the particular audio signal, in a period specified by the process period specifying section as the silent period in the particular audio signal; and
an outputting section which superposes the second audio signal on the particular audio signal to output a resultant audio signal, wherein
the different sound contents respectively include a contents identifier, and
the audio signal processing system further comprises an identifying section that discriminates whether the received sound content is reproduced in the predetermined area or areas other than the predetermined area.

16. The audio signal processing system according to claim 15, wherein
the audio signal generating section includes: a frequency characteristic sensing section which senses frequency characteristic of the other audio signals; and
a similar characteristic signal generating section which generates the second audio signal having a frequency characteristic that is similar to the frequency characteristic sensed by the frequency characteristic sensing section and that has a low similarity to the frequency characteristic of the particular audio signal.

17. The audio signal processing system according to claim 15, wherein the audio signal generating section generates the second audio signal whose phase is opposite to phases of the other audio signals.

18. The audio signal processing system according to claim 15, wherein
- the process period specifying section includes: a sound volume level sensing section which senses sound volume levels of the plurality of audio signals that are received by the receiving section; and
- a specifying section which specifies a period during which the sound volume level that is sensed by the sound volume level sensing section is below a predetermined level continuously in excess of a predetermined time, as the silent period.

19. The audio signal processing system according to claim 15, wherein the process period specifying section has a specifying section which receives data indicating silent periods attached to the plurality of audio signals, and specifies the silent periods of the plurality of audio signals from the data.

20. The audio signal processing system according to claim 15, wherein the plurality of audio signals received by the receiving section are radio audio signals and the radio audio signals respectively include an audio characteristic and content identifier.

* * * * *